US007605784B2

(12) United States Patent
Suh et al.

(10) Patent No.: US 7,605,784 B2
(45) Date of Patent: Oct. 20, 2009

(54) FLAT PANEL DISPLAY

(75) Inventors: Mi-Sook Suh, Yongin-si (KR);
Tae-Wook Kang, Seongnam-si (KR);
Ul-Ho Lee, Yongin-si (KR)

(73) Assignee: Samsung Mobile Display Co., Ltd.,
Yongin (KR)

( * ) Notice: Subject to any disclaimer, the term of this patent is extended or adjusted under 35 U.S.C. 154(b) by 116 days.

(21) Appl. No.: 11/256,344

(22) Filed: Oct. 20, 2005

(65) Prior Publication Data
US 2006/0097628 A1 May 11, 2006

(30) Foreign Application Priority Data
Nov. 8, 2004 (KR) .................. 10-2004-0090603

(51) Int. Cl.
*G09G 3/32* (2006.01)
(52) U.S. Cl. .................. 345/83; 313/504; 313/505; 313/506; 345/72; 345/88; 345/90; 345/100
(58) Field of Classification Search ......... 313/504–506; 345/72, 83, 88, 90, 100
See application file for complete search history.

(56) References Cited

U.S. PATENT DOCUMENTS

| 6,366,017 | B1 * | 4/2002 | Antoniadis et al. .......... 313/506 |
| 6,429,599 | B1 | 8/2002 | Yokoyama |
| 6,768,482 | B2 | 7/2004 | Asano et al. |
| 6,781,148 | B2 * | 8/2004 | Kubota et al. ................. 257/40 |
| 2004/0164668 | A1 | 8/2004 | Kanno et al. |
| 2005/0087740 | A1 | 4/2005 | Matsumoto et al. |
| 2006/0087227 | A1 * | 4/2006 | Yamanaka .................. 313/504 |

FOREIGN PATENT DOCUMENTS

| CN | 1376014 A | 10/2002 |
| JP | 60-218626 | 11/1985 |
| JP | 2001-100657 | 4/2001 |
| JP | 2002-221917 | 8/2002 |

(Continued)

OTHER PUBLICATIONS

Patent Abstracts of Japan, Publication No. 2002-221917, dated Aug. 9, 2002, in the name of Shin Asano et al.

(Continued)

*Primary Examiner*—Nimeshkumar D. Patel
*Assistant Examiner*—Thomas A Hollweg
(74) *Attorney, Agent, or Firm*—Christie, Parker & Hale, LLP

(57) ABSTRACT

A flat panel display with good color mixture of three primary colors to achieve different hues and little signal delay is provided. The display includes signal lines including scan lines and data lines intersecting the scan lines, both arranged along straight lines. Red, green, and blue pixel driving circuit regions are defined by the intersection of the scan lines and the data lines. The pixel driving circuit regions having the same color are arranged adjacent to one another along a column direction. Red, green, and blue pixel driving circuits are placed in the pixel driving circuit regions and are coupled to the red, green, and blue pixel electrodes. The pixel electrodes are adjacent to pixel electrodes of a different color along both row and column directions.

33 Claims, 7 Drawing Sheets

FOREIGN PATENT DOCUMENTS

| | | |
|---|---|---|
| JP | 2003-255858 | 9/2003 |
| KR | 2003-0078012 | 10/2003 |
| WO | WO 2004/075245 A2 | 9/2004 |

OTHER PUBLICATIONS

Korean Patent Abstracts, Publication No. 1020030078012 A, dated Oct. 4, 2003, in the name of Jun Maede et al.

European Search Report for EP application No. 05110220.0-2203 dated May 16, 2006.

China Office action dated Sep. 7, 2008, for corresponding China application 2005101156041, with English translation indicating relevance of listed CN 1376014 reference in this IDS.

SIPO Office action dated May 22, 2009, for corresponding Chinese divisional application 200810003981.X, with English translation, citing Chinese application CN 1376014, previously filed in an IDS dated Sep. 22, 2008, and U.S. Patent 6,366,017, previously cited in U.S. Office action dated Sep. 13, 2007.

* cited by examiner

FLAT PANEL DISPLAY

CROSS-REFERENCE TO RELATED APPLICATION

This application claims priority to and the benefit of Korea Patent Application No. 2004-0090603, filed on Nov. 8, 2004, the entire content of which is incorporated herein by reference.

BACKGROUND OF THE INVENTION

1. Field of the Invention

The present invention relates to a flat panel display, and more particularly, to a full color flat panel display.

2. Description of the Related Art

Flat panel displays are noted as substitutes for cathode ray tube displays because of their light weight, thin structure, and better image quality. Examples of the flat panel display include liquid crystal displays (LCD) and organic light emitting displays (OLED). As compared with the LCD, the OLED has superior brightness and viewing angle and does not require a backlight, which gives the OLED an advantage in realizing a thin display.

Flat panel displays include red, green, and blue pixels for realizing a full color display. The red, green, and blue pixels may be formed in an array with a stripe arrangement, a mosaic arrangement, or a delta arrangement. As compared with the stripe arrangement, both the delta arrangement and the mosaic arrangement are superior in color mixture of three primary colors to achieve different hues and thus more suitable for displaying moving pictures. An OLED having a pixel array with a delta arrangement has been disclosed in U.S. Pat. No. 6,429,599.

FIG. 1 is a plan view of an OLED having a pixel array with the delta arrangement, disclosed in the forgoing U.S. patent. In this figure, red (R), green (G), and blue (B) pixels are arranged in the delta arrangement. In an array with the stripe arrangement, the pixels of adjacent rows line up so that all the R pixels are along the same columns, all the G pixels are along the same columns, and all the B pixels are along the same columns. On the other hand, in the delta arrangement, the pixels along adjacent rows are staggered so that the B pixel of one row forms triangles, or deltas, with the R and G pixels of its two adjacent rows. Each of the R, G, and B pixels includes a first thin film transistor (TFT) 4, a capacitor 5, a second TFT 6, and a pixel electrode 7 of a light emitting diode. Further, a data line 1 and a gate line 3 are coupled to the first TFT 4, and a power line 2 is coupled to the second TFT 6.

As described above, in a delta arrangement, each of the R, G, and B pixels of one row is located adjacent to the other two color pixels of an adjacent row creating a zigzag path from one pixel to the pixel of the same color in an adjacent column. The data line 1 extending in a general column direction, is coupled to the first TFT 4 of pixels of the same color along this zigzag path. The zigzag path increases the resistance of the data line 1 and may delay a data signal. Moreover, the power line 2 also extends along a zigzag path. Hence, the resistance of the power line 2 is also increased that may cause a voltage drop along the line. The delay of the data signal along the data line 1 and the voltage drop along the power line 2 may deteriorate picture quality, which is emerging as a serious problem as the size of the displays increases. Further, such a complicated interconnection layout increases the spaces occupied by the interconnections resulting in a decrease in the aperture ratio.

SUMMARY OF THE INVENTION

The present invention addresses the issues associated with the conventional devices by providing a flat panel display with improved color mixture of three primary colors to achieve different hues and without signal delay or voltage drop.

In an exemplary embodiment of the present invention, a flat panel display includes a substrate and signal lines arranged on the substrate. Pixel driving circuit regions are defined by intersection of the signal lines. Pixel driving circuits are placed in the pixel driving circuit regions. A pixel electrode is coupled to each pixel driving circuit and overlaps at least one of the signal lines.

In another exemplary embodiment of the present invention, a flat panel display includes a substrate and signal lines arranged on the substrate. Pixel driving circuit regions are defined by intersection of the signal lines. Pixel driving circuits are placed in the pixel driving circuit regions. Pixel electrodes are coupled to the pixel driving circuits. The pixel electrodes are arranged differently from the pixel driving circuit regions.

In yet another exemplary embodiment of the present invention, a flat panel display includes a substrate and signal lines arranged on the substrate. At least some of the signal lines include scan lines, and data lines intersecting the scan lines and arranged along straight lines. Pixel driving circuit regions are defined by the intersection of the scan lines and the data lines. Pixel driving circuits are placed in the pixel driving circuit regions. Pixel electrodes are coupled to the pixel driving circuits. The pixel electrodes are adjacent to the pixel electrodes of a different color along row and column directions.

In still another exemplary embodiment of the present invention, a flat panel display includes a substrate and signal lines arranged on the substrate. At least some of the signal lines include scan lines and data lines that intersect the scan lines and are arranged along straight lines. Red, green, and blue pixel driving circuit regions are defined by the intersection of the scan lines and the data lines. The pixel driving circuit regions corresponding to the same color are arranged adjacent to one another along a column direction. Red, green, and blue pixel driving circuits are placed in the pixel driving circuit regions. Red, green, and blue pixel electrodes are coupled to the red, green, and blue pixel driving circuits, respectively. Each of the pixel electrodes are adjacent to pixel electrodes of a different color along both row and column directions.

DETAILED DESCRIPTION

In the following description of the drawings, forming a layer on a different layer or on a substrate may indicate that the layer is directly formed on the different layer or on the substrate. However, it may also indicate that other layers exist between the layer and the different layer or the substrate.

Figure 2:
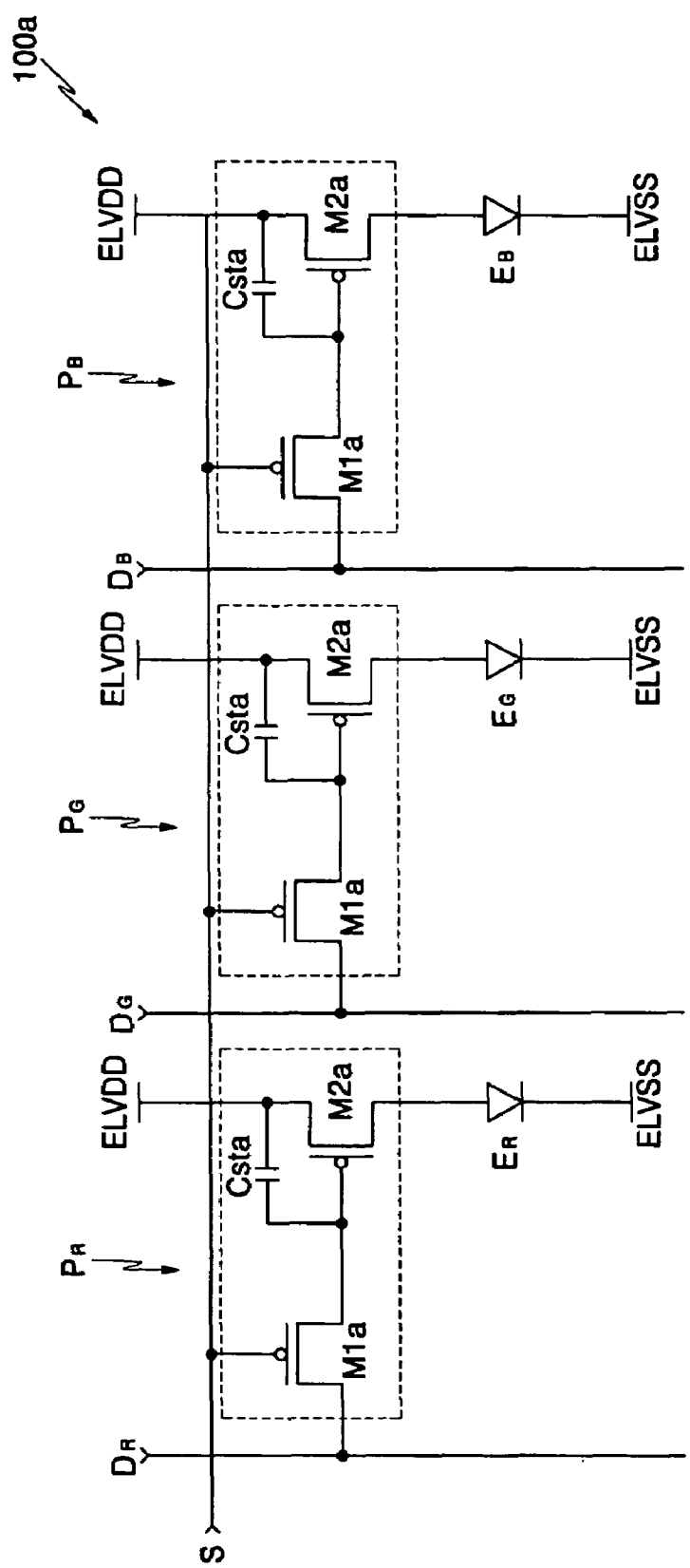
FIG. 2 is a circuit diagram of pixel driving circuits in an OLED according to a first embodiment of the present invention.

FIG. 2 is a circuit diagram of pixel driving circuits 100a in an OLED according to a first embodiment of the present invention. Each of the pixel driving circuits 100a is coupled to signal lines, including a scan line S, a data line $D_R$, $D_G$, $D_B$, and a power line ELVDD. The data lines $D_R$, $D_G$, $D_B$ include a red data line $D_R$, a green data line $D_G$, and a blue data line $D_B$. The red, green, and blue data lines $D_R$, $D_G$, $D_B$ intersect the scan line S, thereby defining a red pixel $P_R$, a green pixel $P_G$, and a blue pixel $P_B$. The red, green, and blue data lines $D_R$, $D_G$, $D_B$ are coupled to the red, green, and blue pixels $P_R$, $P_G$, $P_B$, respectively. Therefore, a data signal having a certain color (red, green, or blue) is transmitted to a data line $D_R$, $D_G$, $D_B$ corresponding to the same color. This pixel driving circuit 100a is driven more easily than a circuit where the data signals corresponding to different colors are transmitted by the same data line.

The pixels include red, green, and blue light emitting diodes $E_R$, $E_G$, $E_B$ and pixel driving circuits 100a for driving the light emitting diodes $E_R$, $E_G$, $E_B$. The pixel driving circuits 100a have a switching transistor M1a, a capacitor Csta, and a driving transistor M2a. The switching transistor M1a has a gate coupled to the scan line S and a source coupled to the data line $D_R$, $D_G$, $D_B$, thereby switching a data signal applied to the data line $D_R$, $D_G$, $D_B$ on the basis of a scan signal applied to the scan line S. The capacitor Csta is coupled between a drain of the switching transistor M1a and the power line ELVDD to store the data signal for a predetermined period. The driving transistor M2a has a gate coupled to the capacitor Csta, a source coupled to the power line ELVDD, and a drain coupled to each light emitting diode $E_R$, $E_G$, $E_B$, thereby supplying a current corresponding to the data signal to each light emitting diode $E_R$, $E_G$, $E_B$. Each light emitting diode $E_R$, $E_G$, $E_B$ emits light corresponding to the supplied current.

Figure 3:
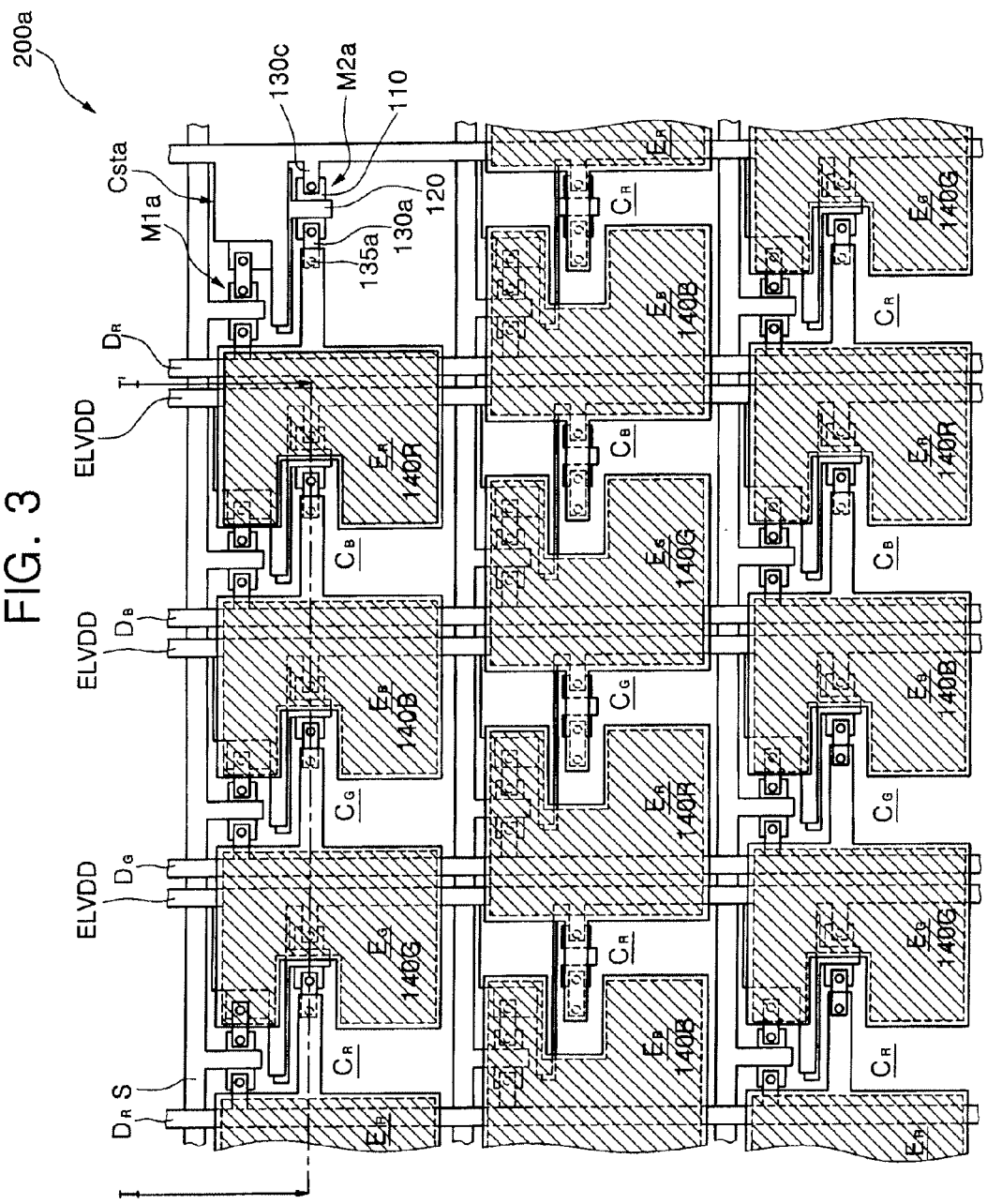
FIG. 3 is a plan view of a pixel array of the OLED according to the first embodiment of the present invention.

FIG. 3 is a plan view of a pixel array 200a of the OLED according to the first embodiment of the present invention, wherein like numerals refer to like elements in FIG. 2. The signal lines include the scan lines S, the data lines $D_R$, $D_G$, $D_B$, and the power lines ELVDD that are arranged on a substrate. Each scan line S extends along a first direction. The data lines $D_R$, $D_G$, $D_B$ include the red data line $D_R$, the green data line $D_G$, and the blue data line $D_B$. Each data line $D_R$, $D_G$, $D_B$ extends along a second direction that intersects the first direction. While extending along intersecting directions, the scan lines S and the data lines $D_R$, $D_G$, $D_B$ are insulated from each other. The power lines ELVDD are also insulated from the scan lines S while intersecting the scan lines S. The power lines ELVDD are arranged along the same direction as the data lines $D_R$, $D_G$, $D_B$.

Pixel driving circuit regions $C_R$, $C_G$, $C_B$ are defined by the signal lines, in particular, by the scan lines S and the data lines $D_R$, $D_G$, $D_B$ intersecting each other. In this embodiment, the pixel driving circuit region $C_R$, $C_G$, $C_B$ indicates a region in which a pixel driving circuit 100a for controlling a signal applied to the light emitting diode $E_R$, $E_G$, $E_B$ is located. Therefore, the pixel driving circuit region $C_R$, $C_G$, $C_B$ is a region where all the elements of the pixel driving circuit 100a shown in FIG. 2 are located. The light emitting diode $E_R$, $E_G$, $E_B$ is not located on the pixel driving circuit region $C_R$, $C_G$, $C_B$.

Figure 1:
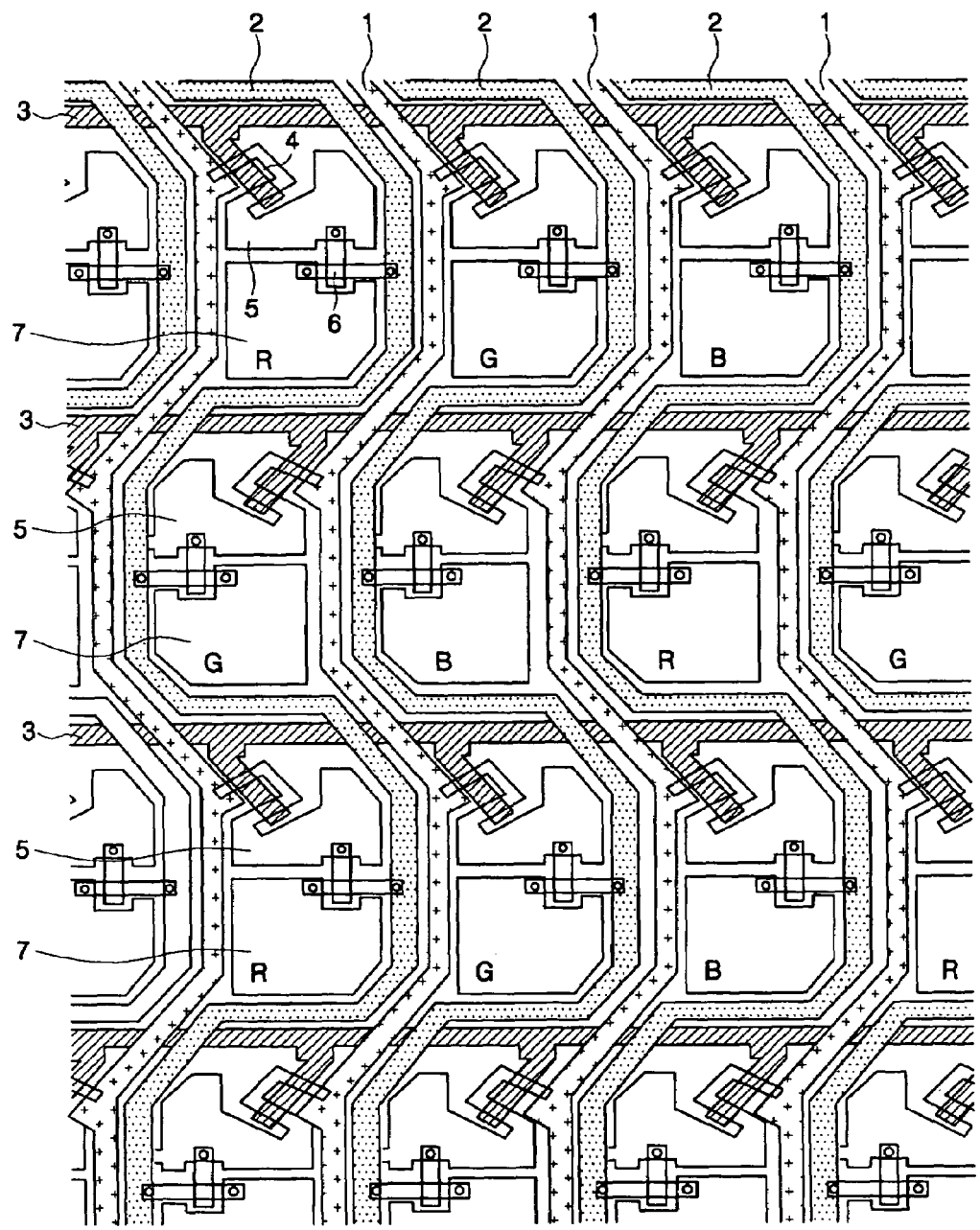
FIG. 1 is a plan view of a conventional OLED having a pixel array with a delta arrangement.

Among the pixel driving circuit regions $C_R$, $C_G$, $C_B$, the regions having the same color are arranged adjacent to one another along a column direction. For example, the red pixel driving circuit regions $C_R$ lie along the same columns. In other words, the pixel driving circuit regions $C_R$, $C_G$, $C_B$ have a stripe arrangement. Therefore, the data lines $D_R$, $D_G$, $D_B$, that are sequentially coupled to the pixels of corresponding color, may be arranged also along straight lines. This is in contrast to the zigzag lines of FIG. 1. In the configuration shown in FIG. 3, the length of each data line $D_R$, $D_G$, $D_B$ is shortened and the line resistance is decreased, thereby preventing the data signal applied to each data line $D_R$, $D_G$, $D_B$ from being delayed. The power line ELVDD may be arranged also along straight lines. Therefore, the line resistance of the power line ELVDD is also decreased and a voltage drop in the voltage supplied to the power line ELVDD is prevented. Consequently, picture quality is improved. Further, an area occupied by both the data lines $D_R$, $D_G$, $D_B$ and the power lines ELVDD is decreased, thereby improving aperture ratio.

The red, green, and blue pixel driving circuits 100a are placed on the red, green, and blue pixel driving circuit regions $C_R$, $C_G$ and $C_B$, respectively. Each pixel driving circuit 100a includes the switching transistor M1a, the capacitor Csta, and the driving transistor M2a. The red, green, and blue pixel driving circuits 100a are coupled to red, green, and blue pixel electrodes 140R, 140G, 140B, respectively. In more detail, a drain electrode 130a of the driving transistor M2a is coupled to each pixel electrode 140R, 140G, 140B. An opening, denoted by reference numeral 145a in FIG. 4B, is defined as an emission region in each pixel electrode 140R, 140G, 140B. An organic emission layer and an opposite electrode are placed in sequence above the opening of each pixel electrode 140R, 140G, 140B. The pixel electrodes 140R, 140G, 140B, the organic emission layer, and the opposite electrode constitute the light emitting diodes $E_R$, $E_G$, $E_B$.

The pixel electrodes 140R, 140G, 140B are arranged differently from the pixel driving circuit regions $C_R$, $C_G$, $C_B$. Each pixel electrode 140R, 140G, 140B is arranged adjacent to a pixel electrode of a different color along both row and column directions. For example, the red pixel electrode 140R is adjacent to both the green, and blue pixel electrodes 140G, 140B along the row and column directions but not to another red pixel electrode 140R. For illustration purposes, if we assume that the middle row in FIG. 3 is an odd-numbered row, then the pixel electrodes 140R, 140G, 140B in odd-numbered rows are to the right of the pixel driving circuit regions $C_R$, $C_G$, $C_B$ and the pixel electrodes 140R, 140G, 140B in even-numbered rows are to the left of the pixel driving circuit regions $C_R$, $C_G$, $C_B$. This leads to a delta arrangement of the pixel electrodes 140R, 140G, 140B in FIG. 3. Delta arrangement improves color mixture of three primary colors to achieve different hues and enhances picture quality. Accordingly, while the signal lines extend along straight lines, the pixel electrodes 140R, 140G, 140B may lie in a delta arrangement which realizes effective color mixture. A length of the pixel driving circuit region $C_R$, $C_G$, $C_B$ along the row direction corresponds to a pitch of one. In one embodiment, the pixel electrodes 140R, 140G, 140B are to the left or right of the pixel driving circuit regions $C_R$, $C_G$, $C_B$ with a pitch ranging from 0.5 to 1.5 in consideration of the color mixture. Preferably, the pitch is 0.75. The pixel electrodes 140R, 140G, 140B may overlap at least some portion of the signal lines.

As described above, the pixel driving circuit regions $C_R$, $C_G$, $C_B$ having the same color are located adjacent to one another along the column direction, while the pixel electrodes 140R, 140G, 140B are located adjacent to a pixel electrode of a different color along both row and column directions, so that color mixture of three primary colors to achieve different hues is realized without a signal delay, thereby improving picture quality.

Figure 4A:
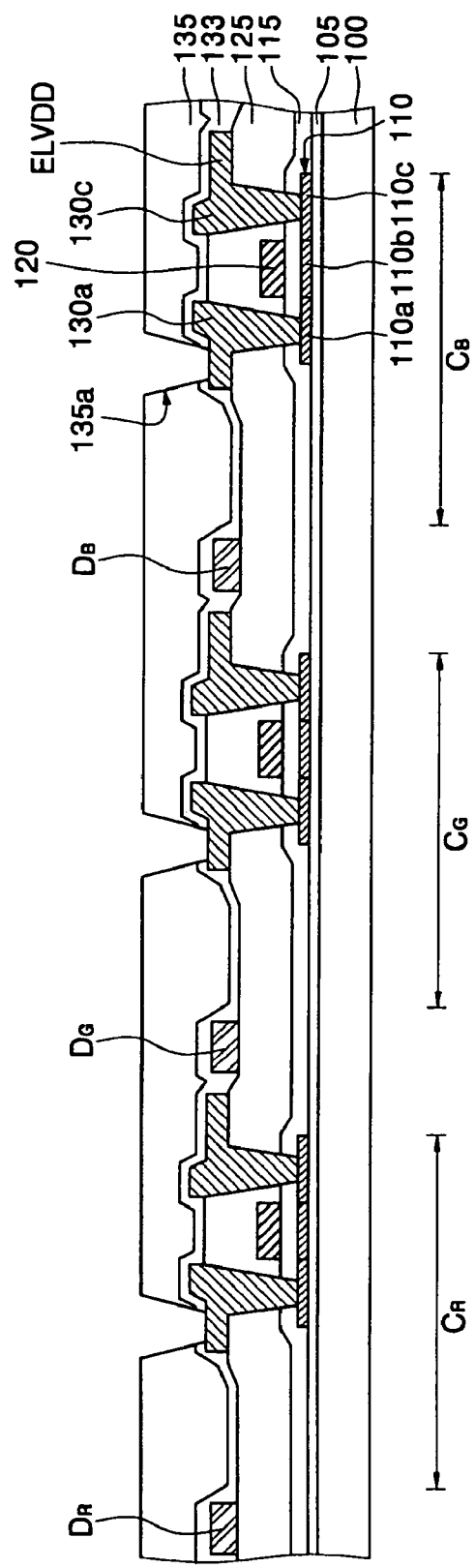
FIGS. 4A and 4B are cross-sectional views of the OLED according to the first embodiment of the present invention, taken along the line I-I' in FIG. 3.
Figure 4B:
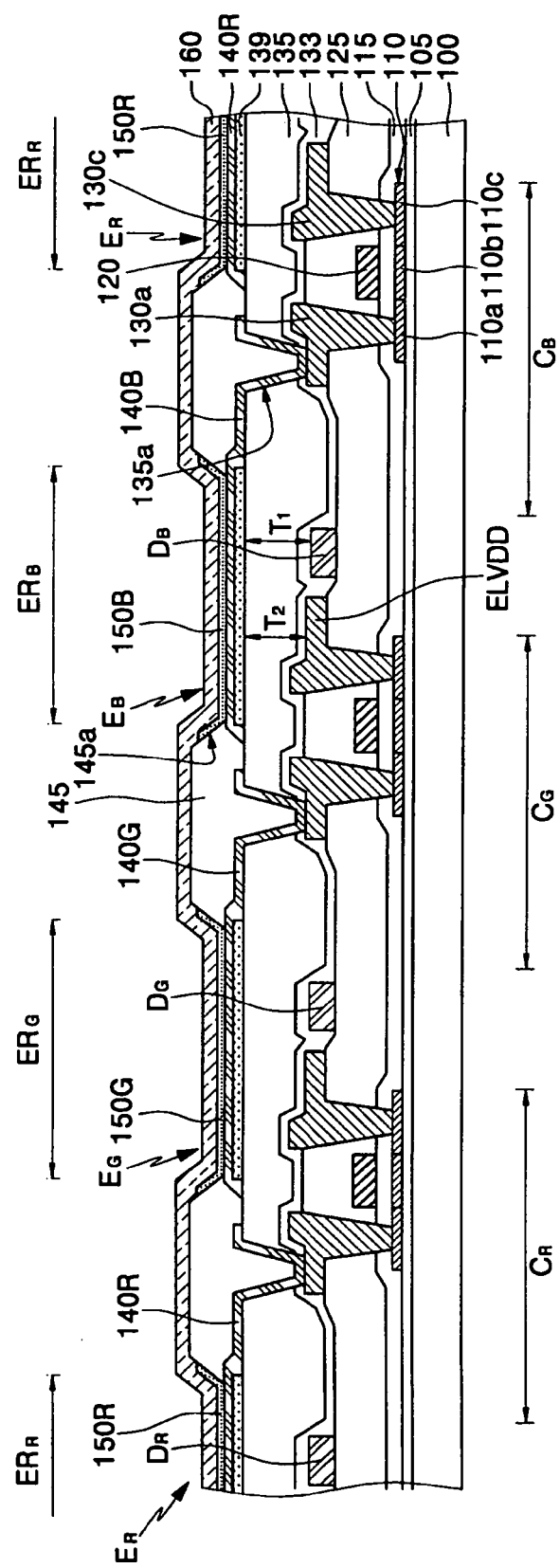

FIGS. 4A and 4B are cross-sectional views of the OLED according to the first embodiment of the present invention, taken along the line I-I' in FIG. 3.

FIG. 4A shows a substrate 100 having a red pixel driving circuit region $C_R$, a green pixel driving circuit region $C_G$, and a blue pixel driving circuit region $C_B$. The substrate 100 may be a transparent substrate or an opaque substrate. Further, the substrate 100 may be a glass substrate, a plastic substrate, a quartz substrate, a silicon substrate, or a metal substrate. A buffer layer 105 may be formed on the substrate 100. The buffer layer 105 may include a silicon oxide layer, a silicon nitride layer, a silicon oxynitride layer, or a multi-layer combination of the foregoing material.

A semiconductor layer 110 is formed on the buffer layer 105. The semiconductor layer 110 may include an amorphous silicon layer or a polycrystalline silicon layer crystallized from the amorphous silicon layer. In one embodiment, the semiconductor layer 110 includes a polycrystalline silicon layer with high mobility. A gate insulating layer 115 is formed on the semiconductor layer 110. The gate insulating layer 115 includes a silicon oxide layer, a silicon nitride layer, a silicon oxynitride layer, or a multi-layer combination of the foregoing material.

A gate electrode 120 is formed on the gate insulating layer 115 in the same area where the semiconductor layer 110 lies below the gate insulating layer 115. While the gate electrode 120 is being formed, a scan line S (refer to FIG. 3) may also be formed. Next, conductive impurities are implanted into the semiconductor layer 110 by using the gate electrode 120 as a mask to form a source region 110c and a drain region 110a. A channel region 110b is defined between the source region 110c and the drain region 110a. A first inter-insulating layer 125 is formed on the gate electrode 120 and the semiconductor layer 110. Further, contact holes are formed through the first inter-insulating layer 125 to expose the source and drain regions 110c, 110a. A conductive layer is deposited on the substrate having the contact holes, and then patterned to form a source electrode 130c, the drain electrode 130a, the data lines $D_R$, $D_G$, $D_B$, and the power line ELVDD. The source electrode 130c and the drain electrode 130a are in contact with the exposed source and drain regions 110c,110a, respectively. Thus, the driving transistor M2a (refer to FIG. 3) is formed by the semiconductor layer 110, the gate electrode 120, the source electrode 130c and the drain electrode 130a.

A second inter-insulating layer 133, 135 is formed on the substrate having the source and drain electrodes 130c, 130a. The second inter-insulating layer 133, 135 may be a passivation layer 133, a planarization layer 135, or a double layer where the planarization layer 135 is deposited on the passivation layer 133. The passivation layer 133 may be formed of a silicon oxide layer, a silicon nitride layer, a silicon oxynitride layer, or a multi-layer including a combination of the foregoing. In one embodiment, the passivation layer 133 includes a silicon nitride layer capable of effectively protecting the thin film transistors below from gas and moisture, and containing abundant hydrogen for passivation of incomplete bonds in a grain boundary of the polycrystalline silicon layer. The planarization layer 135 is an organic layer such as a benzocyclobutene (BCB) layer, a polyimide layer, or a polyacrylic layer, which is used to provide a smooth cover for the surface below. A via hole 135a is formed through the second inter-insulating layer 133, 135 to expose the drain electrode 130a.

Referring to FIG. 4B, pixel electrodes 140R, 140G, 140B are formed on the substrate each having one of the via holes 135a. In the embodiment shown, the pixel electrodes 140R, 140G, 140B are formed over the second inter-insulating layer 133, 135. The pixel electrodes 140R, 140G, 140B are coupled to the drain electrodes 130a exposed through the via holes 135a.

As described above, the pixel electrodes 140R, 140G, 140B are arranged differently from the pixel driving circuit regions $C_R$, $C_G$, $C_B$. In more detail, the pixel electrodes 140R, 140G, 140B are arranged to the left of the pixel driving circuit regions $C_R$, $C_G$, $C_B$. The pixel electrodes 140R, 140G, 140B are coupled to the drain electrodes 130a of the pixel driving regions $C_R$, $C_G$, $C_B$. Each pixel electrode 140R, 140G, 140B is formed over at least some of the signal lines, for example, the data line $D_R$, $D_G$, $D_B$ and the power line ELVDD. In one embodiment, a thickness T1 of the second inter-insulating layer 133, 135 formed between the pixel electrodes 140R, 140G, 140B and the data lines $D_R$, $D_G$, $D_B$, or a thickness T2 of the second inter-insulating layer 133, 135 formed between the pixel electrodes 140R, 140G, 140B and the power line ELVDD may be 5000 Å or more. As a result of having a relatively large separation, the parasitic capacitance between the pixel electrodes 140R, 140G, 140B and the data lines $D_R$, $D_G$, $D_B$, and the parasitic capacitance between the pixel electrodes 140R, 140G, 140B and the power lines ELVDD may be minimized. Preferably, these thicknesses T1, T2, i.e. the thicknesses of the second inter-insulating layer 133, 135 may be 5000 Å to 3 μm (30,000 Å) in consideration of an aspect ratio of the via hole 135a.

The pixel electrodes 140R, 140G, 140B are made of a reflective conductive layer. The reflective conductive layer may include Ag, Al, Ni, Pt, Pd, or an alloy of these elements which has a high work function. In this case, the pixel electrodes 140R, 140G, 140B function as anodes. Alternatively, the reflective conductive layer may include Mg, Ca, Al, Ag, Ba or an alloy of these elements which has a low work function. In this case, the pixel electrodes 140R, 140G, 140B function as cathodes.

On the other hand, a reflective layer pattern 139 may be additionally formed underneath the pixel electrodes 140R, 140G, 140B before forming the pixel electrodes 140R, 140G, 140B. In this case, the pixel electrodes 140R, 140G, 140B must be made of a transparent conductive layer. The transparent conductive layer includes an indium tin oxide (ITO) layer or an indium zinc oxide (IZO) layer. In one embodiment, the reflective layer pattern 139 may have a reflectivity of 60% or more. Further, the reflective layer pattern 139 includes Al, an aluminum alloy, Ag, a silver alloy, or an alloy including any combination of these metals and alloys. The reflective layer pattern 139 may be spaced apart from the via hole 135a.

Pixel defining layers 145 are formed on the pixel electrodes 140R, 140G, 140B. The pixel defining layer 145 may be formed from a benzocyclobutene (BCB), an acrylic-based photoresist, a phenolic-based photoresist, or an imide-based photoresist. Openings 145a are formed in the pixel defining layers 145 to expose at least some portion of the pixel electrodes 140R, 140G, 140B.

A red emission layer 150R, a green emission layer 150G, and a blue emission layer 150B are formed on the red, green, and blue pixel electrodes 140R, 140G, 140B exposed through the openings 145a. Each emission layer may be formed by a vacuum deposition method, an inkjet printing method, and a laser-induced thermal imaging method. Further, a hole injection layer, a hole transport layer, a hole blocking layer, an electron transport layer, or an electron injection layer (not shown) may be formed on or beneath the emission layers 150R, 150G, 150B. Then, an opposite electrode 160 is formed on the emission layers 150R, 150G, 150B. The opposite electrode 160 may be formed over the entire substrate. The opposite electrode 160 may be formed of a transparent conductive layer. The transparent conductive layer may be an ITO or an IZO layer, or may include an element selected from a group consisting of Mg, Ca, Al, Ag, Ba, or any alloy of these elements, which is thin enough to transmit the light.

The pixel electrodes 140R, 140G, 140B, the emission layers 150R, 150G, 150B, and the opposite electrode 160 form the light emitting diodes $E_R$, $E_G$, $E_B$, respectively. Emission regions $ER_R$, $ER_G$, $ER_B$ of the light emitting diodes $E_R$, $E_G$, $E_B$ are defined by the openings 145a.

While the light emitting diodes $E_R$, $E_G$, $E_B$ are driven to operate, holes and electrons are injected from the pixel electrode and the opposite electrode into the emission layers 150R, 150G, 150B. Then, the holes and the electrons injected into the emission layers 150R, 150G, 150B are combined in the emission layers 150R, 150G, 150B to create excitons. When the excitons transition from an excited state to a ground state, light is emitted. The light emitted from the emission layers 150R, 150G, 150B is reflected from the pixel electrodes 140R, 140G, 140B (in the case where the pixel electrodes 140R, 140G, 140B are made of a reflective conductive layer), or reflected from the reflective layer pattern 139 beneath the pixel electrodes 140R, 140G, 140B (in the case where the pixel electrodes 140R, 140G, 140B are made of a transparent conductive layer), and is then emitted to the outside through the opposite electrode 160 that is made of a transparent conductive layer.

Figure 5:
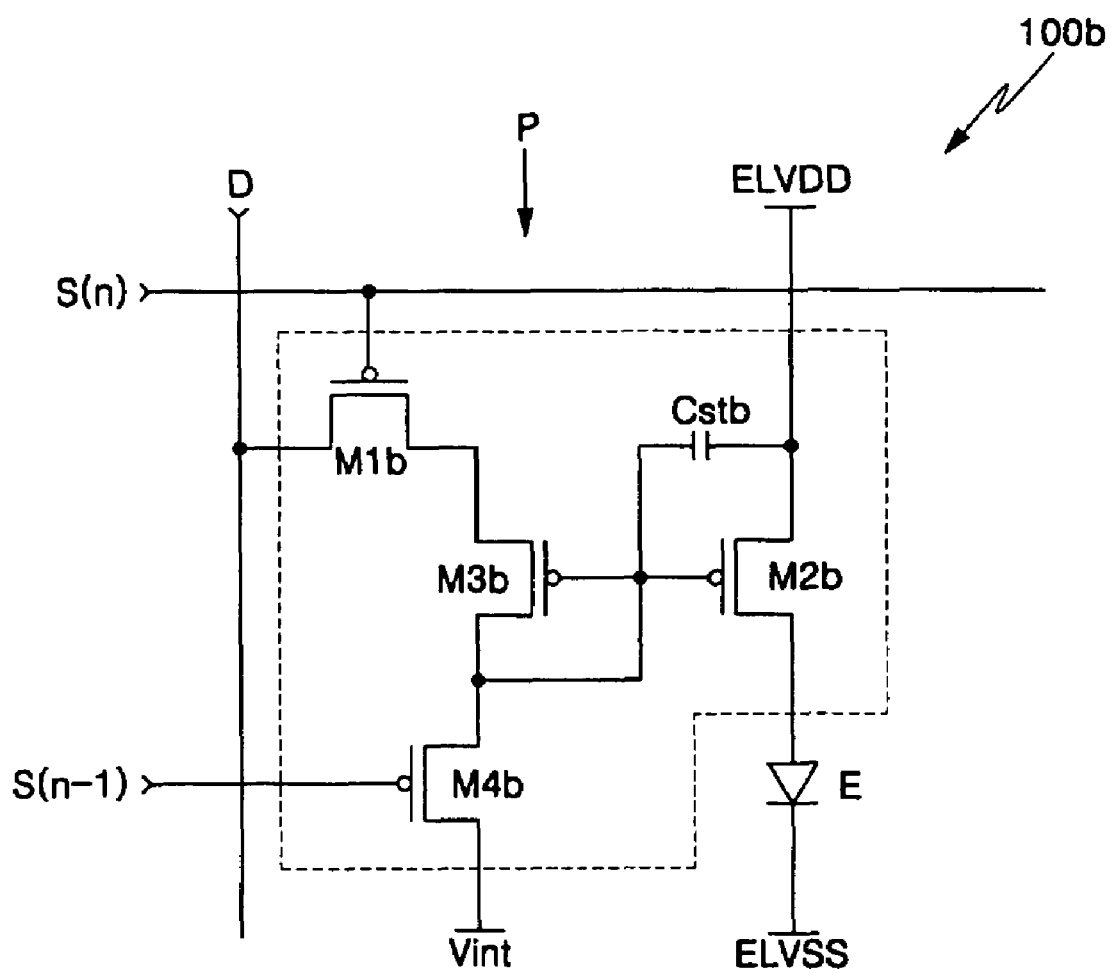
FIG. 5 is a circuit diagram of a pixel driving circuit in an OLED according to a second embodiment of the present invention.

FIG. 5 is a circuit diagram of a pixel driving circuit 100b in an OLED according to a second embodiment of the present invention. An $(n-1)^{th}$ scan line S(n−1), an $n^{th}$ scan line S(n), a data line D, a power line ELVDD, and a pre-charge line Vint are coupled to the pixel driving circuit 100b. A pixel P is defined by intersection of the data line D and the scan line S(n). The pixel P includes a light emitting diode E and a pixel driving circuit 100b for driving the light emitting diode E that could be any of the red, green, or blue light emitting diodes $E_R$, $E_G$, $E_B$. Depending on the light emitting diode $E_R$, $E_G$, $E_B$, and the data line D, that could be a red, green, or blue data line $D_R$, $D_G$, $D_B$, the pixel P may be a red, green, or blue pixel $P_R$, $P_G$, $P_B$. The pixel driving circuit is composed of first through fourth transistors M1b, M2b, M3b, M4b, and a capacitor Cstb.

The first transistor M1b includes a gate coupled to the scan line S(n), and a source coupled to the data line D. The third transistor M3b includes a source coupled to a drain of the first transistor M1b, and a gate and a drain coupled to each other. The fourth transistor M4b includes a gate coupled to the $(n-1)^{th}$ scan line S(n−1), a source coupled to a drain of the third transistor M3b, and a drain coupled to the pre-charge line Vint. The second transistor M2b includes a gate coupled to the gate of the third transistor M3b, a source coupled to the power line ELVDD, and a drain coupled to the light emitting diode E. The capacitor Cstb is coupled between the gate of the third transistor M3b and the power line ELVDD. The light emitting diode E, that may be any of the red, green, or blue light emitting diodes $E_R$, $E_G$, $E_B$, includes a pixel electrode, an opposite electrode, and an emission layer interposed between the pixel electrode and the opposite electrode. The pixel electrode, opposite electrode, and emission layer of the light emitting diode E are similar to the pixel electrode 140R, 140G, 140B, the opposite electrode 160, and the emission layer 150R, 150G, 150B shown in FIG. 4B for the light emitting diode $E_R$, $E_G$, $E_B$ of the first embodiment 100a.

An OLED having the foregoing pixel driving circuit 100b of to the second embodiment of the present invention has a similar pixel layout to that illustrated for the first embodiment 100a in FIG. 3. However, in the pixel driving circuit 100b of the second embodiment, the pre-charge line Vint is added in a row or column direction and the third and fourth transistors M3b, M4b are added also. The first through fourth transistors M1b, M2b, M3b, M4b and the capacitor Cstb of the second embodiment 100b are placed in pixel driving circuit regions that are similar to the pixel driving regions $C_R$, $C_G$, $C_B$ of the first embodiment shown in FIG. 3. The pixel electrode (similar to the pixel electrode 140R, 140G, 140B of the first embodiment) may overlap the pre-charge line Vint.

Figure 6:
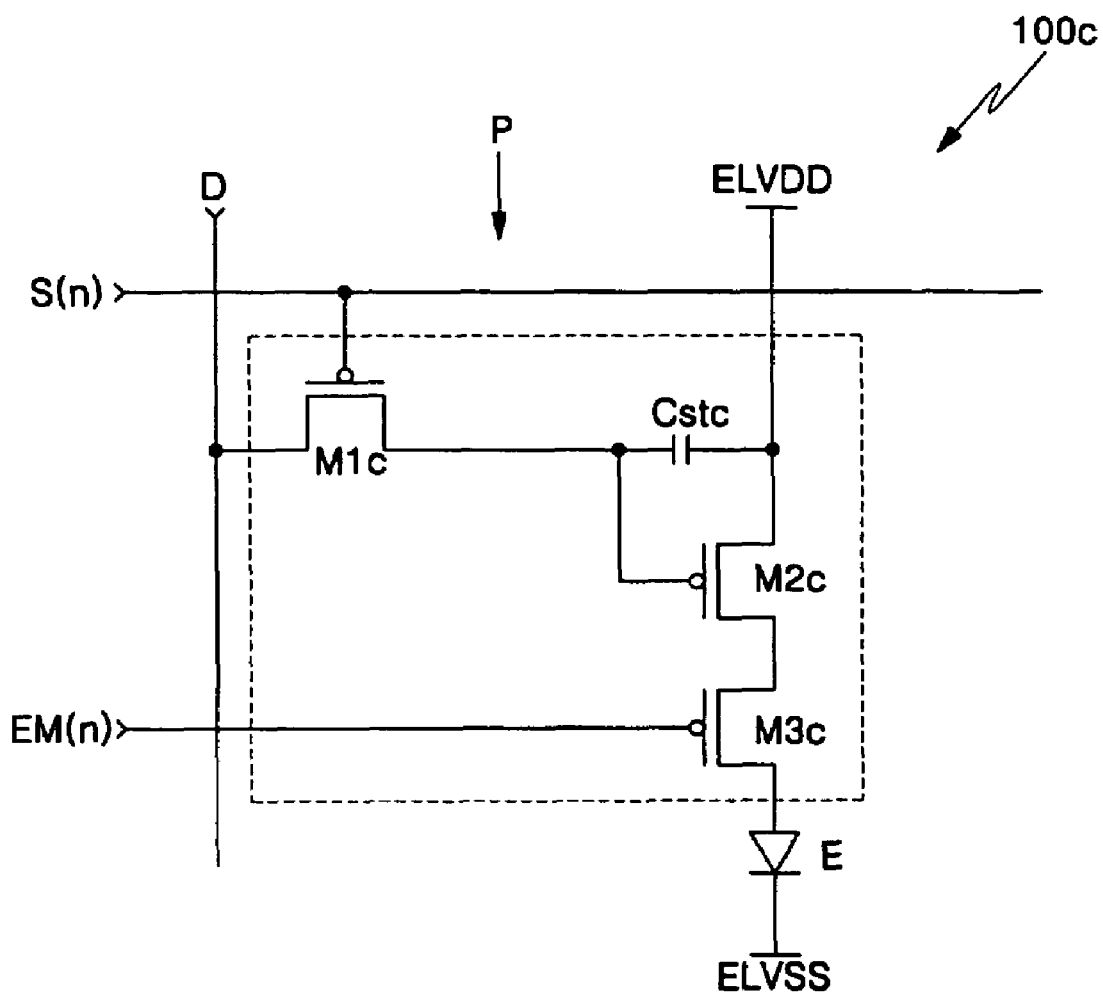
FIG. 6 is a circuit diagram of a pixel driving circuit in an OLED according to a third embodiment of the present invention.

FIG. 6 is a circuit diagram of a pixel driving circuit 100c in an OLED according to a third embodiment of the present invention. Signal lines, including a scan line S(n), a data line D, a power line ELVDD, and an emission control line EM(n) to the pixel driving circuit 100c. The data line D and the scan line S(n) intersect each other, defining a pixel P. The pixel P includes a light emitting diode E, that may be any of the red, green, or blue light emitting diodes $E_R$, $E_G$, $E_B$, and a pixel driving circuit 100c for driving the light emitting diode E. The pixel driving circuit 100c includes first through third transistors M1c, M2c, M3c and a capacitor Cstc.

The first transistor M1c includes a gate coupled to the scan line S, and a source coupled to the data line D. The second transistor M2c includes a gate coupled to a drain of the first transistor M1c, and a source coupled to the power line ELVDD. The capacitor Cstc is coupled between the gate of the second transistor M2c and the power line ELVDD. The third transistor M3c includes a gate coupled to the emission control line EM(n), a source coupled to a drain of the second transistor M2c, and a drain coupled to the light emitting diode E. The light emitting diode E includes a pixel electrode, an opposite electrode, and an emission layer interposed between the pixel electrode and the opposite electrode. The pixel electrode, opposite electrode, and emission layer of the light emitting diode E are similar to the pixel electrode 140R, 140G, 140B, the opposite electrode 160, and the emission layer 150R, 150G, 150B shown in FIG. 4B for the light emitting diode $E_R$, $E_G$, $E_B$ of the first embodiment 100a.

An OLED having the foregoing pixel driving circuit 100c according to the third embodiment of the present invention has the same pixel layout as that illustrated in FIG. 3, except that the emission control line EM(n) is added in a row or column direction, and the first through third transistors M1c, M2c, M3c and the capacitor Cstc are placed in the pixel driving circuit regions (similar to the pixel driving regions $C_R$, $C_G$, $C_B$ of the first embodiment shown in FIG. 3). The pixel electrode (similar to the pixel driving electrode 140R, 140G, 140B of the first embodiment) may overlap the emission control line EM(n).

In this specification, embodiments of the OLED are described by way of example. The present invention may also be applied to the LCD and in particular to a reflective type LCD employing external light.

As described above, the pixel driving circuit regions $C_R$, $C_G$, $C_B$ having the same color are arranged adjacent to one another along a column direction, and each pixel electrode 140R, 140B, 140G is arranged adjacent to pixel electrodes 140R, 140B, 140G having a different color along both row and column directions. This arrangement yields both of color mixture of three primary colors to achieve different hues and good picture quality without a signal delay or voltage drop.

Although the present invention has been described with reference to certain exemplary embodiments, it will be understood by those skilled in the art that a variety of modifications and variations may be made to the present invention without departing from the spirit or scope of the present invention defined in the appended claims, and their equivalents.

What is claimed is:

1. A flat panel display comprising:
a substrate;
signal lines on the substrate;
pixel driving circuits at pixel driving circuit regions defined by crossings of the signal lines; and
pixel electrodes coupled to the pixel driving circuits and overlapping at least one of the signal lines, the pixel driving circuits arranged in columns extending in a column direction, each of the columns comprising the pixel driving circuits corresponding to a same color,
wherein at least two pixel electrodes of the pixel electrodes of the same color coupled to the pixel driving circuits in a same one of the columns are offset from each other in a row direction perpendicular to the column direction.

2. The flat panel display as claimed in claim 1, wherein the pixel electrodes are arranged in a first arrangement pattern and the pixel driving circuit regions are arranged in a second arrangement pattern, the first arrangement pattern being different from the second arrangement pattern.

3. The flat panel display as claimed in claim 1, wherein the pixel electrodes of one color are adjacent to the pixel electrodes of a different color along the column direction and along the row direction crossing the column direction.

4. The flat panel display as claimed in claim 3, wherein the pixel electrodes are arranged in a delta arrangement.

5. The flat panel display as claimed in claim 1, wherein the signal lines include scan lines and data lines crossing the scan lines, the scan lines and the data lines extending along straight lines.

6. The flat panel display as claimed in claim 5, wherein the signal lines further include power lines crossing the scan lines and extending along straight lines.

7. The flat panel display as claimed in claim 1, further comprising an insulating layer interposed between at least one of the signal lines and the pixel electrodes, the insulating layer having a thickness of 5000 Å or more.

8. The flat panel display as claimed in claim 7, wherein the insulating layer interposed between the at least one of the signal lines and the pixel electrodes has a thickness of 3 µm or less.

9. The flat panel display as claimed in claim 1, wherein the flat panel display is an organic light emitting display.

10. The flat panel display as claimed in claim 1, wherein the pixel electrodes are formed from a reflective conductive layer.

11. The flat panel display as claimed in claim 1, wherein the pixel electrodes are formed from a transparent conductive layer, and the flat panel display further comprises a reflective layer pattern formed under the transparent conductive layer.

12. A flat panel display comprising:
a substrate;
signal lines on the substrate;
pixel driving circuits at pixel driving circuit regions defined by crossings of the signal lines; and
pixel electrodes coupled to the pixel driving circuits, the pixel driving circuits arranged in columns extending in a column direction, each of the columns comprising the pixel driving circuits corresponding to a same color,
wherein at least two pixel electrodes of the pixel electrodes of the same color coupled to the pixel driving circuits in a same one of the columns are offset from each other in a row direction perpendicular to the column direction.

13. The flat panel display as claimed in claim 12, wherein the pixel electrodes of one color are adjacent to the pixel electrodes of a different color along the column direction and along the row direction crossing the column direction.

14. The flat panel display as claimed in claim 13, wherein the pixel electrodes are arranged in a delta arrangement.

15. The flat panel display as claimed in claim 12, wherein the signal lines include scan lines and data lines crossing the scan lines, the scan lines and the data lines extending along straight lines.

16. The flat panel display as claimed in claim 15, wherein the signal lines further include power lines crossing the scan lines and extending along straight lines.

17. The flat panel display as claimed in claim 12, wherein the flat panel display is an organic light emitting display.

18. The flat panel display as claimed in claim 12, wherein the pixel electrodes are formed from a reflective conductive layer.

19. The flat panel display as claimed in claim 12, wherein the pixel electrodes are formed from a transparent conductive layer, and the flat panel display further comprises a reflective layer pattern formed under the transparent conductive layer.

20. The flat panel display of claim 12, wherein the pixel electrodes are arranged in a first arrangement pattern and the pixel driving circuit regions are arranged in a second arrangement pattern, the first arrangement pattern being different from the second arrangement pattern.

21. A flat panel display comprising:
a substrate;
signal lines on the substrate, the signal lines including scan lines and data lines crossing the scan lines, the scan lines and the data lines arranged along straight lines;
pixel driving circuits at pixel driving circuit regions defined by crossings of the scan lines and the data lines; and
pixel electrodes coupled to the pixel driving circuits, the pixel electrodes being adjacent to pixel electrodes of a different color along row and column directions, the pixel driving circuits arranged in columns extending in a column direction, each of the columns comprising the pixel driving circuits corresponding to a same color,
wherein at least two pixel electrodes of the pixel electrodes of the same color coupled to the pixel driving circuits in a same one of the columns are offset from each other in the row direction perpendicular to the column direction.

22. The flat panel display as claimed in claim 21, wherein the signal lines include power lines crossing the scan lines and arranged along straight lines.

23. The flat panel display as claimed in claim 21, wherein the pixel electrodes are arranged in a delta arrangement.

24. The flat panel display as claimed in claim 21, wherein the flat panel display is an organic light emitting display.

25. The flat panel display as claimed in claim 21, wherein the pixel electrodes are formed from a reflective conductive layer.

26. The flat panel display as claimed in claim 21, wherein the pixel electrodes are formed from a transparent conductive layer, and the flat panel display further comprises a reflective layer pattern formed under the transparent conductive layer.

27. A flat panel display comprising:
a substrate;
signal lines on the substrate, the signal lines including scan lines and data lines crossing the scan lines, the scan lines and the data lines arranged along straight lines;
red, green, and blue pixel driving circuit regions defined by the crossings of the scan lines and the data lines, the pixel driving circuit regions of a same color among the pixel driving circuit regions being arranged adjacent to one another along a column direction;

red, green, and blue pixel driving circuits at the red, green, and blue pixel driving circuit regions, respectively; and red, green, and blue pixel electrodes coupled to the red, green, and blue pixel driving circuits respectively, the red, green, and blue pixel electrodes being adjacent to pixel electrodes of a different color along the column direction and along a row direction crossing the column direction, wherein at least two pixel electrodes of the pixel electrodes of a same color coupled to the pixel driving circuits in a same one of the columns are offset from each other in the row direction perpendicular to the column direction.

28. The flat panel display as claimed in claim 27, wherein the pixel electrodes are arranged in a delta arrangement.

29. The flat panel display as claimed in claim 27, wherein the flat panel display is an organic light emitting display.

30. The flat panel display as claimed in claim 27, wherein the pixel electrodes are formed from a reflective conductive layer.

31. The flat panel display as claimed in claim 27, wherein the pixel electrodes are formed from a transparent conductive layer, and the flat panel display further comprises a reflective layer pattern formed under the transparent conductive layer.

32. A flat panel display comprising:
a substrate;
signal lines on the substrate;
pixel driving circuits at pixel driving circuit regions defined by crossings of the signal lines; and
pixel electrodes coupled to the pixel driving circuits and overlapping at least one of the signal lines, the pixel driving circuits arranged in columns extending in a column direction, each of the columns comprising the pixel driving circuits corresponding to a same color,
wherein the pixel electrodes of the same color are alternately located either at a first side or a second side of one of the columns of the pixel driving circuits corresponding to the same color along the column direction.

33. The flat panel display of claim 32, wherein the pixel electrodes are arranged in a first arrangement pattern and the pixel driving circuit regions are arranged in a second arrangement pattern, the first arrangement pattern being different from the second arrangement pattern.

* * * * *